US006272037B1

(12) United States Patent
Miyamoto

(10) Patent No.: US 6,272,037 B1
(45) Date of Patent: Aug. 7, 2001

(54) FERROELECTRIC MEMORY DEVICE AND METHOD FOR GENERATING REFERENCE LEVEL SIGNAL THEREFOR

(75) Inventor: Yasuo Miyamoto, Tenri (JP)

(73) Assignee: Sharp Kabushiki Kaisha (JP)

(*) Notice: Subject to any disclaimer, the term of this patent is extended or adjusted under 35 U.S.C. 154(b) by 0 days.

(21) Appl. No.: 09/645,720

(22) Filed: Aug. 24, 2000

(30) Foreign Application Priority Data

Jan. 21, 2000 (JP) .................................. 12-013566

(51) Int. Cl.[7] .................................. G11C 11/22
(52) U.S. Cl. ...................... 365/145; 365/149; 365/189.09
(58) Field of Search .................... 365/145, 149, 365/189.09

(56) References Cited

U.S. PATENT DOCUMENTS 5,424,975 * 6/1995 Lowrey et al. ....................... 365/145
5,621,680   4/1997 Newman et al. .
6,091,623 * 7/2000 Kang ..................................... 365/145

FOREIGN PATENT DOCUMENTS 10-50075   2/1998 (JP) .

* cited by examiner

Primary Examiner—Huan Hoang
(74) Attorney, Agent, or Firm—Morrison & Foerster LLP

(57) ABSTRACT

A ferroelectric memory device of the present invention includes at least one memory cell which includes a semiconductor transistor and a ferroelectric capacitor, the ferroelectric memory device reading out data from each of the at least one memory cell and comparing the read data with a reference level signal to amplify a signal corresponding to the data read out from the at least one memory cell. The ferroelectric memory device further includes: at least one of an external voltage detection circuit for detecting a level of a voltage externally provided to the ferroelectric memory device and a temperature detection circuit for detecting an ambient temperature around the ferroelectric memory device; a reference signal generation circuit connected to the at least one of the external voltage detection circuit and the temperature detection circuit for outputting a potential based on an output from the at least one of the external voltage detection circuit and the temperature detection circuit; and a reference level adjustment section for adjusting the potential output from the reference signal generation circuit into a suitable reference level signal.

11 Claims, 17 Drawing Sheets

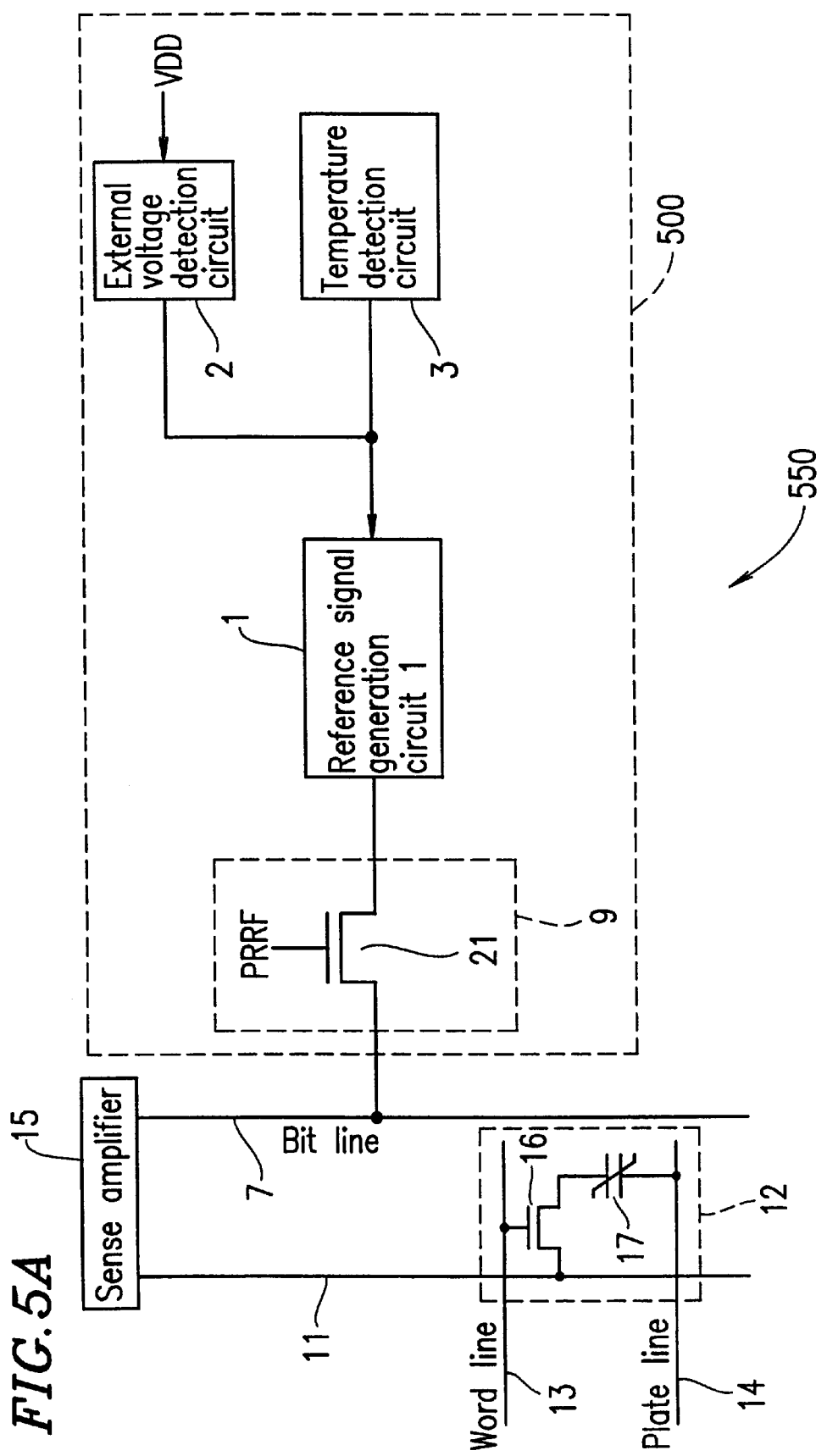

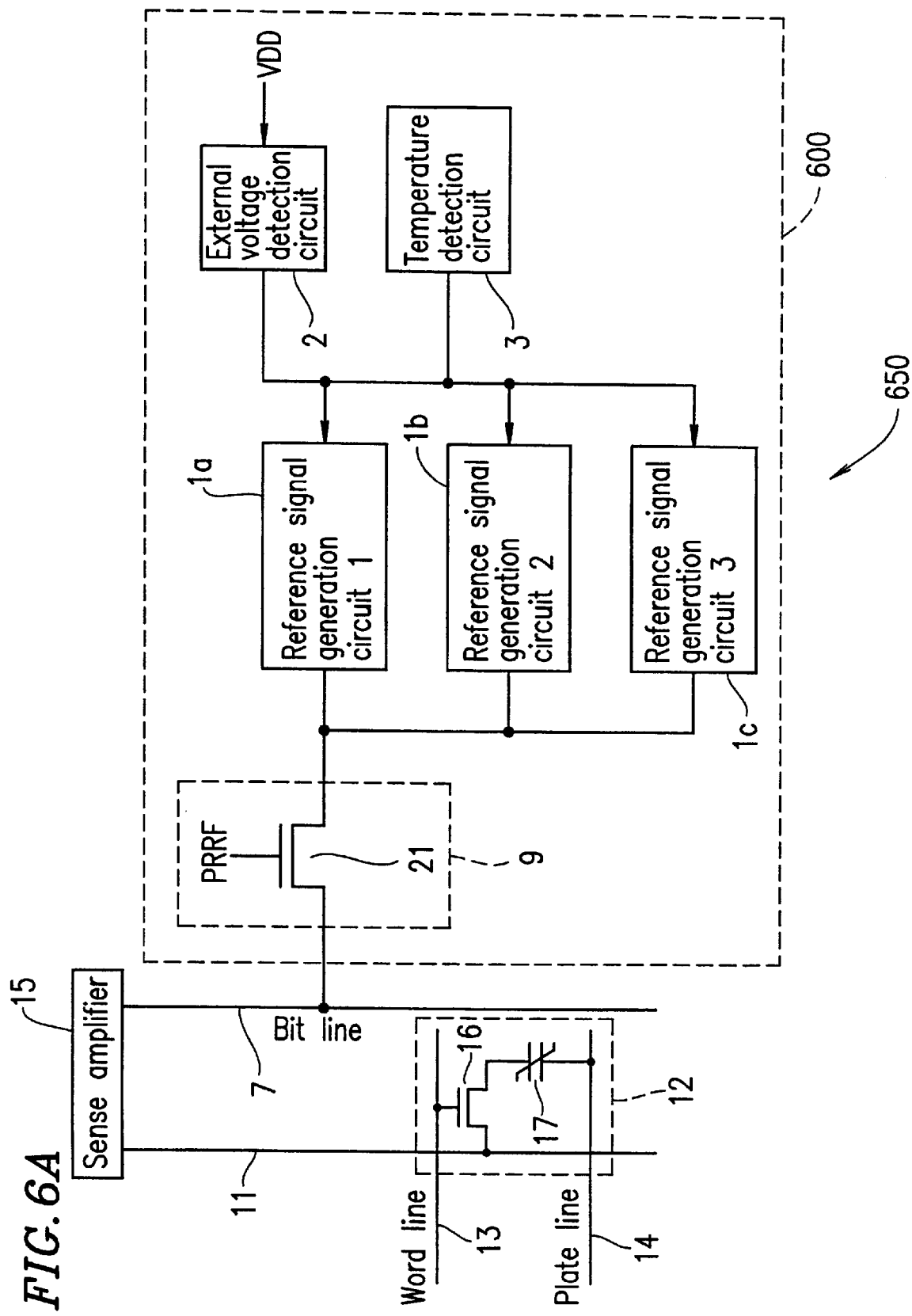

US 6,272,037 B1

FERROELECTRIC MEMORY DEVICE AND METHOD FOR GENERATING REFERENCE LEVEL SIGNAL THEREFOR

BACKGROUND OF THE INVENTION

1. Field of the Invention

The present invention relates to a ferroelectric memory device and a method for generating a reference, level signal therefor. More particularly, the present invention relates to a 1T1C type ferroelectric memory, device and a method for generating a reference level signal therefor.

2. Description of the Related Art

A ferroelectric memory device includes a plurality of memory cells each of which includes a semiconductor transistor (or a switch) and a ferroelectric capacitor. The memory cells are selectively activated by selectively turning ON/OFF the semiconductor transistors. Information is stored in the memory device based on the polarity of the ferroelectric capacitor. A 1T1C type ferroelectric memory device includes a plurality of memory cells each of which includes a transistor, e.g., a MOS (Metal Oxide Semiconductor) transistor, and a ferroelectric capacitor. A potential output from a memory cell (i.e., information which has been stored in the ferroelectric capacitor of the memory cell) is compared with a reference level signal to amplify a signal corresponding to the data from the memory cell.

FIG. 7A illustrates, in a simplified manner, a reference level generation circuit 700 of a conventional ferroelectric memory device as disclosed in Japanese Laid-Open Publication No. 10-50075. Referring to FIG. 7A the reference level generation circuit 700 includes two reference cells 102 and 103. The reference cells 102 and 103 are both connected to a RWL (reference word line) signal line. The reference cells 102 and 103 are also connected to bit lines 100a and 100b, respectively. Each of the bit lines 100a and 100b crosses the RWL signal line and a BSH (bit line short) signal line. The reference level generation circuit 700 further includes a switch transistor 101. The gate of the switch transistor 101 is connected to the BSH signal line, the source/drain of the switch transistor 101 are respectively connected to the bit lines 10a and 100b. The reference level generation circuit 700 uses two reference cells, each having the same structure as that of a memory cell in a ferroelectric memory device (not shown), for outputting an "L" level signal (data "0") and an "H" level signal (data "1"), respectively. The two potentials are shorted with each other so as to generate an intermediate level between the "H" level and the "L" level, which is used as a reference level.

The generation of the reference level will be described with reference to a timing diagram shown in FIG. 7B. Referring to FIG. 7B, first, a RWL signal is activated (indicated as the transition to the "H" level). Then, as illustrated in FIG. 7A, data obtained by inverting data "0" is output from the reference cell 102 to the bit line 100a, and data obtained by inverting data "1" is output from the reference cell 103 to the bit line 100b. While the RWL signal is activated, a BSH signal is activated (indicated as the transition to the "H" level). Thus, the reference level generation circuit 700 illustrated in FIG. 7A closes the switch transistor 101 so as to short the respective outputs from the reference cells 102 and 103 with each other, thereby setting the potential of each of the bit lines 100a and 100b to an intermediate level (reference level) between the "H" level and-the "L" level. After the reference level is generated, the reference level generation circuit 700 enables a sense amplifier (not shown) by activating an SAE (sense amp enable) signal (indicated as the transition to the "H" level) so as to compare the output from the selected memory cell with the reference level and amplify a signal corresponding to the output from the selected memory cell.

In this conventional example, each memory cell and each reference cell have the same structure, and a reference level is generated by shorting with each other the "H"level and the "L" level which are output from the two reference cells 102 and 103, respectively. Therefore, the reference level is an intermediate level which is centered between the "H" level and the "L" level. However, this conventional example has a problem in that the reference cells 102 and 103, each of which is a ferroelectric capacitor as that used in a memory cell, may deteriorate over time. Generally, a reference cell is accessed more often than a normal memory cell. Therefore, a memory device may become inoperable due to the deterioration of the reference cells even through the memory cells remain operable. This problem can be overcome by increasing the number of reference cells to be provided, which however undesirably increases the chip area.

In order to solve this problem, a ferroelectric memory device 850 having a reference level generation circuit 800 as illustrated in FIG. 8A has been proposed in the art. The reference level generation circuit 800 includes a reference signal generation circuit 107, a capacitor 106 for storing a potential (level) output from the reference signal generation circuit 107, and switch transistors 104 and 105 for controlling the capacitor 106 and the reference signal generation circuit 107, respectively. In the reference level generation circuit 800, the reference signal generation circuit 107 is connected to the source of the switch transistor 105, and the drain of the switch transistor 105 is connected to the first electrode of the capacitor 106 and the source of the switch transistor 104. The second electrode of the capacitor 106 is connected to a ground. The gates of the switch transistors 104 and 105 are connected to an RWL line and a PRC (pre-charge control) line, respectively. The drain of the switch transistor 104 is connected to a bit line 100. The potential generated by the reference signal generation circuit 107 is charged into the capacitor 106, and the capacitor 106 is shorted with the bit line 100s. Thus, a potential (reference level) is generated onto the bit line 100a by virtue of the charge sharing between the capacitor 106 and the bit line 100c. A sense amplifier 15 is connected to the bit line 100c and also to another bit line 11, which is connected to a memory cell 12. The memory cell 12 includes a semiconductor transistor 16 and a ferroelectric capacitor 17. The source of the semiconductor transistor 16 is connected to the bit line 11, the drain of the semiconductor transistor 16 is connected to a first electrode of the ferroelectric capacitor 17, and the gate of the semiconductor transistor 16 is connected to a word line 13. A second electrode of the ferroelectric capacitor 17 is connected to a plate line 14. With such a configuration, the output from the selected memory cell 12 is compared with the reference level signal to amplify the signal corresponding to the output of the memory cell 12.

The generation of the reference level by the reference level generation circuit 800 of the ferroelectric memory device 850 illustrated in FIG. 8A will be described with reference to a timing diagram shown in FIG. 8B. Referring to FIG. 8B, a PRC signal is activated (indicated as the transition to the "H" level) to close the switch transistor 105 so that the capacitor 106 is charged by the reference signal generation circuit 107. Then, the PRC signal is deactivated (indicated as the transition to the "L" level), after which RWL signal is activated (indicated as the transition to the "H" level) so as to close the switch transistor 104. Thus, a reference level is generated onto the bit line 100c by virtue of the charge sharing between the capacitor 106 and the bit line 100c. After the reference level is generated, the SAE signal is activated so as to enable the sense amplifier 15. Thus, the output from the selected memory cell 12 is compared with the reference level signal to amplify the signal corresponding to the output of the memory cell 12.

In the case of the reference level generation circuit 800 illustrated in FIG. 8A, the potential output from the reference signal generation circuit 107 is not at an intermediate level between the "H" level and the "L" level which is to be output onto the bit line 100c. This is because, in this configuration, the potential output from the reference signal generation circuit 107 is not directly supplied to the bit line 100c, and it is only necessary that the potential which is finally output onto the bit line 100c is at the intermediate level between the "H" level and the "L" level. Thus, the output from the reference signal generation circuit 107 is adjusted so that the potential appearing on the bit line 100c is at the intermediate level between the "H" level and the "L" level.

With such a configuration, the reference signal generation circuit 107 does not use a ferroelectric capacitor, thereby avoiding the problem associated with the first conventional example of FIG. 7A, i.e., the problem associated with the deterioration of reference cells.

In still another conventional example, FIG. 9A illustrates a ferroelectric memory device 950 having a reference level generation circuit 900. The reference level generation circuit 900 includes a reference signal generation circuit 109, a pulse generation circuit 110 and a capacitor 108. Pulses are provided to a bit line 100d, and the potential of the bit line 100d is boosted by the capacitance ratio of the capacitor 108. The reference signal generation circuit 109 is connected to the pulse generation circuit 110, and the pulse generation circuit 110 is connected to the first electrode of the capacitor 108. The second electrode of the capacitor 108 is connected to the bit line 100d. The memory cell 12 of FIG. 9A has the structure as described above in connection with the ferroelectric memory device 850 with reference to FIG. 8A. In the configuration illustrated in FIG. 9A, the "H" level of the pulse used to boost the bit line 100d is determined based on the output from the reference signal generation circuit 109. Thus, the output from the reference signal generation circuit 109 is adjusted so that the boosted potential appearing on the bit line 100d is at the intermediate level between the "H" level and the "L" level.

This operation will be described with reference to a timing diagram shown in FIG. 9B. In FIG. 9B, "REF" denotes the output from the reference signal generation circuit 109, based on which the potential of the "H" level of the pulse is determined. The timing of the "H" level of the pulse is determined by the pulse generation circuit 110. Moreover, the transition of the SAE signal for the sense amplifier 15 is the same as described above with reference to FIGS. 7B and 8B.

In still another conventional example, FIG. 10A illustrates a ferroelectric memory device 1050 having a reference level generation circuit 1000. In the reference level generation circuit 1000, a reference signal generation circuit 112 is connected a bit line 100e via a switch transistor 111. A PRRF (pre-charge reference) signal is input to the gate of the switch transistor 111. In the reference signal generation circuit 112, a reference level is generated by means of resistance division, or the like, without using a ferroelectric element, and the generated reference level (potential) is directly supplied to the bit line 100e. The memory cell 12 of FIG. 10A has the structure as described above in connection with the ferroelectric memory device 850.

This operation will be described with reference to a timing diagram shown in FIG. 10B. Referring to FIG. 10B, the PRRF signal is activated (indicated as the transition to the "H" level) so as to close the switch transistor 111. Thus, a reference level generated by the reference signal generation circuit 112 is supplied onto the bit line 10e. After the reference level is generated, the SAE signal is activated (indicated as the transition to the "H" level) so as to enable the sense amplifier 15. Thus, the output from the selected memory cell 12 is compared with the reference level signal to amplify the signal corresponding to the output of the memory cell 12.

The problem associated with the first conventional reference signal generation circuit 700 shown in FIG. 7A, i.e., the problem associated with the deterioration of reference cells, can be avoided by employing these conventional reference level generation circuits 800, 900 and 1000 of the ferroelectric memory devices 850, 950 and 1050 illustrated in FIGS. 8A, 9A and 10A, respectively.

However, in these ferroelectric memory devices, the amount of data (or charge) which is output from a ferroelectric memory cell is influenced by various environmental factors such as the level of a voltage externally provided to the device (hereinafter, also referred to as the "externally provided voltage" or simply as the "external voltage") or the ambient temperature around the device (hereinafter, referred to simply as the "ambient temperature").

When the level of the externally provided voltage or the ambient temperature changes, the output of the reference signal generation circuit changes in response to the changes in the circuit characteristics due to the voltage or temperature changes. These changes in the output of the reference signal generation circuit are different from changes in the characteristics of a ferroelectric element due to voltage or temperature changes. Thus, since the conventional reference level generation circuits 800, 900 and 1000 of the ferroelectric memory devices 850, 950 and 1050 illustrated in FIGS. 8A, 9A and 10A, respectively, do not use a ferroelectric element, which is used in the memory cell 12 of a ferroelectric memory device, the generated reference level does not follow changes in the characteristics of the ferroelectric element due to changes in the environmental factors such as the voltage or the temperature.

SUMMARY OF THE INVENTION

According to one aspect of this invention, there is provided a ferroelectric memory device including at least one memory cell which includes a semiconductor transistor and a ferroelectric capacitor, the ferroelectric memory device reading out data from each of the at least one memory cell and comparing the read data with a reference level signal to amplify a signal corresponding to the data read out from the at least one memory cell. The ferroelectric memory device further includes: at least one of an external voltage detection circuit for detecting a level of a voltage externally provided to the ferroelectric memory device and a temperature detection circuit for detecting an ambient temperature around the ferroelectric memory device; a reference signal generation circuit connected to the at least one of the external voltage detection circuit and the temperature detection circuit for outputting a potential based on an output from the at least one of the external voltage detection circuit and the temperature detection circuit: and a reference level adjustment section for adjusting the potential output from the reference signal generation circuit into a suitable reference level signal.

In one embodiment of the invention, the ferroelectric memory device includes a plurality of the reference signal generation circuits. The at least one of the external voltage detection circuit and the temperature detection circuit selects an optimal one of the plurality of the reference signal generation circuits.

In one embodiment of the invention, the reference signal generation circuit does not include a ferroelectric element.

In one embodiment of the invention, the reference signal generation circuit includes a ferroelectric element. The ferroelectric element does not undergo polarization during the adjustment of the potential output from the reference signal generation circuit into a suitable reference level signal.

In one embodiment of the invention, the reference level adjustment section includes a capacitor for temporarily storing a potential.

In one embodiment of the invention, the reference level adjustment section further includes at least two switches. The reference signal generation circuit is connected to the capacitor via one of the two switches. The capacitor is connected to the memory cell via the other one of the two switches.

In one embodiment of the invention, the ferroelectric memory device further includes a pulse generation circuit for determining a timing of the signal generated by the reference signal generation circuit.

In one embodiment of the invention, the reference level adjustment section includes a capacitor between the pulse generation circuit and the memory cell.

In one embodiment of the invention, the reference level adjustment section includes a switch.

In one embodiment of the invention, the pulse generation circuit generates a pulse having an "H" level and a "L" level, the "H" level corresponding to a potential generated by the reference level generation circuit and the "L" level corresponding to VDD or another potential which is lower than the "H" level.

According to another aspect of this invention, there is provided a method for generating a reference level signal for use in a ferroelectric memory device, including at least one memory cell which includes a semiconductor transistor and a ferroelectric capacitor, the ferroelectric memory device reading out data from each of the at least one memory cell and comparing the read data with a reference level signal to amplify a signal corresponding to the data read out from the at least one memory cell. The method includes the steps of: detecting at least one of a level of a voltage externally provided to the ferroelectric memory device and an ambient temperature around the ferroelectric memory device; providing a potential based on at least one of the level of the externally provided voltage and the temperature; and adjusting the potential into a reference level signal having a potential level between an "H" level and an "L" level of the memory cell.

The functions of the present invention will now be described.

According to the present invention, a reference level is generated by a potential generation circuit, or the like, which is provided by way of a resistance division, without using a ferroelectric capacitor or any other ferroelectric element. Where a ferroelectric capacitor or any other ferroelectric element is used, the ferroelectric capacitor can be used as a path condenser for the reference signal generation circuit so as to generate a reference level without polarization of the ferroelectric element. Thus, it is possible to avoid the problem associated with the deterioration of reference cells as in the prior art. By the use of a ferroelectric element, it is possible to obtain a large capacitance for a small area.

It is possible to employ a single reference signal generation circuit capable of generating a plurality of different potentials. In such a case, when the level of the externally provided voltage or the ambient temperature changes, the potential output from the reference level generation circuit can be changed according to the outputs from a voltage detection circuit, a temperature detection circuit, and the like, so as to generate a reference level which is close to the intermediate level between the "H" level and the "L" level. Alternatively, it is possible to selectively activate one of a plurality of reference signal generation circuits which generate respectively different potentials so as to generate a reference level which is close to the intermediate level between the "H" level and the "L" level. Thus, the reference level can be controlled to follow changes in the characteristics of a ferroelectric element.

Thus, the invention described herein makes possible the advantages of (1) providing a ferroelectric memory device which is free of problems associated with deterioration in reference cells, and in which the reference level can be controlled to follow changes in the characteristics of a ferroelectric element due to changes in the environmental factors such as the level of the externally provided voltage or the ambient temperature; and (2) providing a method for generating a reference level signal for such a ferroelectric memory device.

These and other advantages of the present invention will become apparent to those skilled in the art upon reading and understanding the following detailed description with reference to the accompanying figures.

BRIEF DESCRIPTION OF THE DRAWINGS

FIG. 5A illustrates a circuit configuration for generating a reference level used in a ferroelectric memory device according to Embodiment 5 of the present invention;

FIG. 6A illustrates a circuit configuration for generating a reference level used in a ferroelectric memory device according to Embodiment 6 of the present invention;

DESCRIPTION OF THE PREFERRED EMBODIMENTS

Various embodiments of the present invention will now be described with reference to the drawings.

Embodiment 1

Figure 1A:
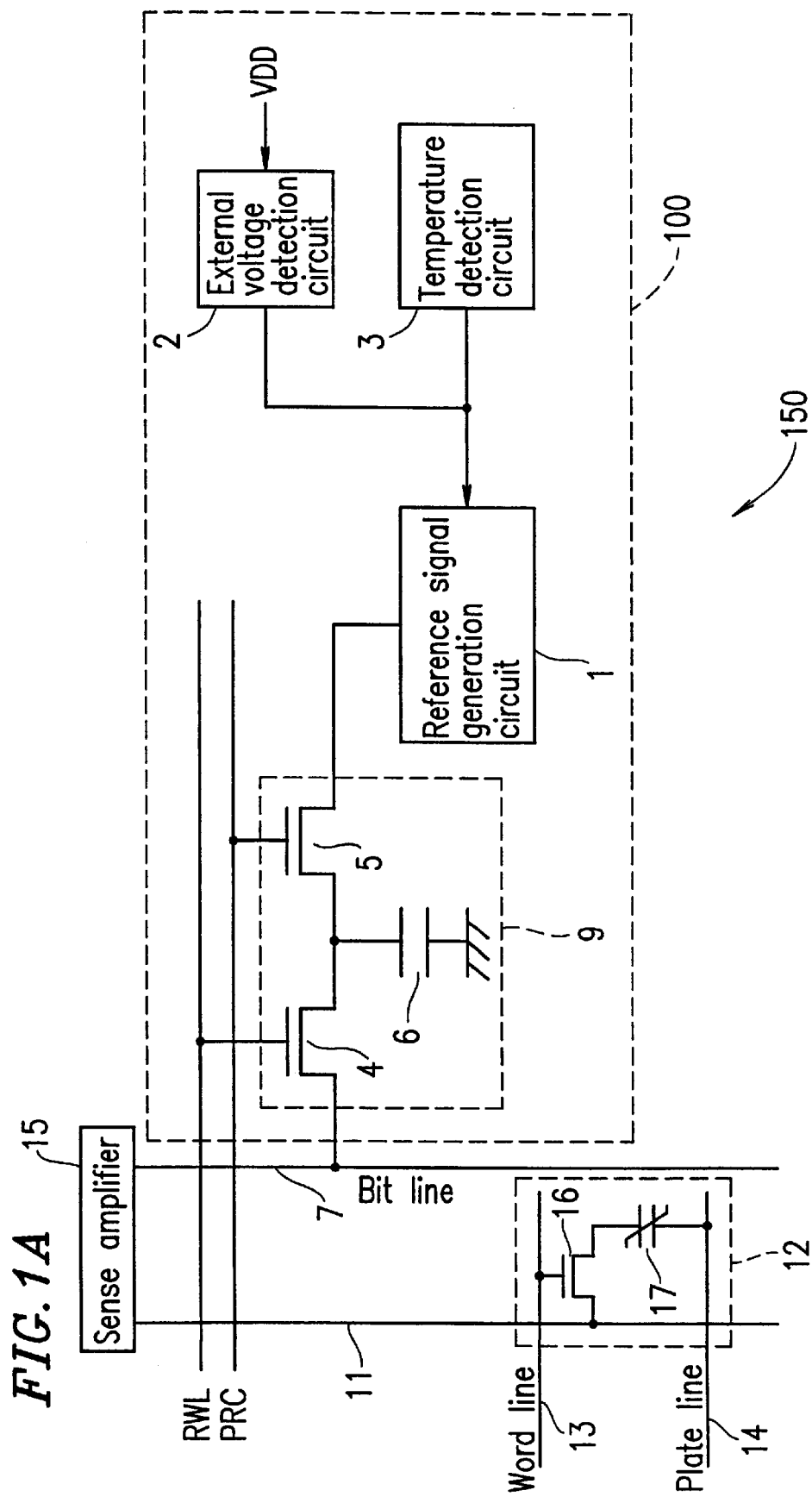
FIG. 1A illustrates a circuit configuration for generating a reference level used in a ferroelectric memory device according to Embodiment 1 of the present invention.

FIG. 1A illustrates a ferroelectric memory device 150 according to Embodiment 1 of the present invention, including a reference level generation circuit 100 for generating a reference level.

The reference level generation circuit 100 of the ferroelectric memory device 150 includes a reference signal generation circuit 1 for generating a plurality of different potentials (levels), an external voltage detection circuit 2 for detecting a potential of externally provided voltage VDD, a temperature detection circuit 3 for detecting the ambient temperature, and a reference level adjustment section 9 for adjusting the potential generated by the reference signal generation circuit 1. The reference signal generation circuit 1 may be a constant voltage generation circuit, or the like, which is provided by way of a resistance division or based on a band gap, without using a ferroelectric element. In this embodiment, the reference level adjustment section 9 of the reference level generation circuit 100 includes switch transistors 4 and 5 and a capacitor 6. In the reference level generation circuit 100, the external voltage detection circuit 2 detects the potential of externally provided voltage VDD. The external voltage detection circuit 2 and the temperature detection circuit 3 are each connected to the reference signal generation circuit 1. The potential output from the reference signal generation circuit 1 is adjusted by the reference level adjustment section 9 so that the potential appearing on a bit line 7 is at the intermediate level between the "H" level and the "L" level. The output of the reference signal generation circuit 1 is connected to the source of the switch transistor 5 included in the reference level adjustment section 9. The drain of the switch transistor 5 is connected to the first electrode of the capacitor 6 and to the source of the switch transistor 4. The second electrode of the capacitor 6 is connected to the ground. The gates of the switch transistors 4 and 5 are connected to the RWL line and the PRC line, respectively. The drain of the switch transistor 4 is connected to the bit line 7. The external voltage detection circuit 2 may be a circuit which compares an external voltage with the voltage generated by a constant voltage generation circuit. The temperature detection circuit 3 may be implemented by way of a resistance division using a plurality of resistors having different temperature coefficients.

The sense amplifier 15 connected to the bit line 7 is also connected to another bit line 11, which is connected to the memory cell 12. The memory cell 12 includes the semiconductor transistor 16 and the ferroelectric capacitor 17. The source of the semiconductor transistor 16 is connected to the bit line 11, the drain of the semiconductor transistor 16 is connected to the first electrode of the ferroelectric capacitor 17, and the gate of the semiconductor transistor 16 is connected to the word line 13. The second electrode of the ferroelectric capacitor 17 is connected to the plate line 14. With such a configuration, the output from the selected memory cell 12 is compared with the reference level signal to amplify the signal corresponding to the output of the memory cell 12.

Figure 8A:
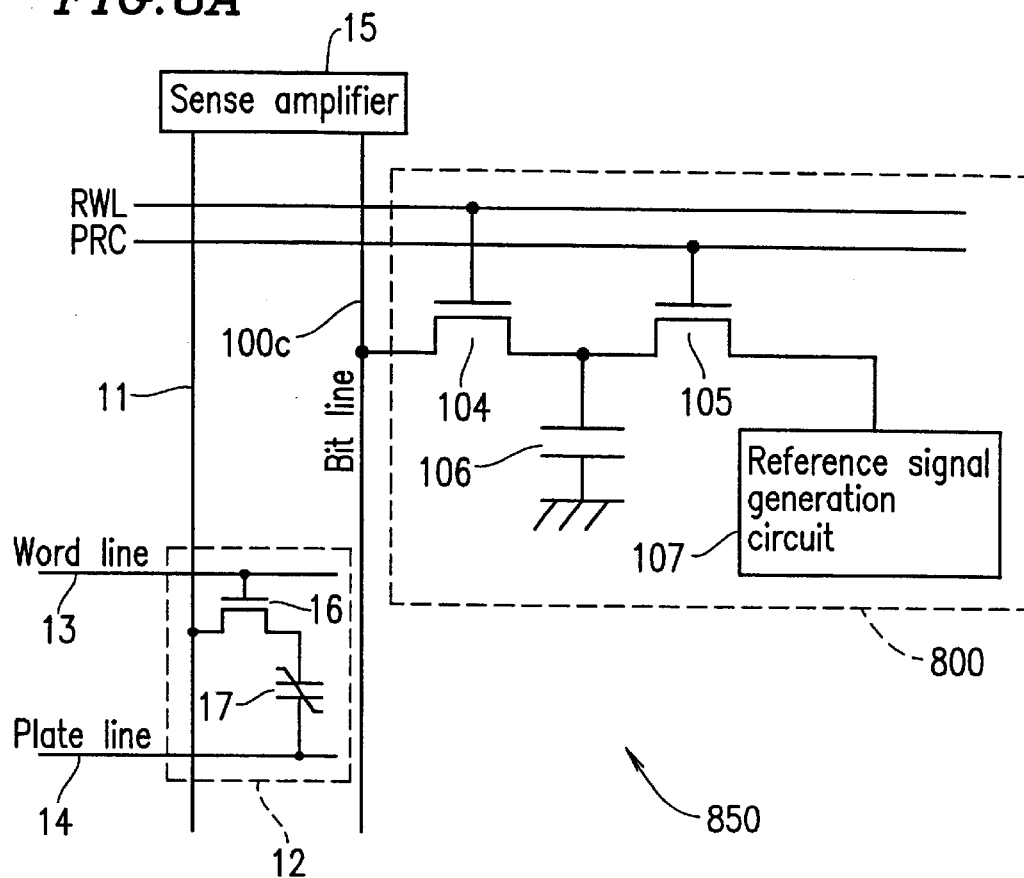
FIG. 8A Illustrates a circuit configuration for generating a reference level used in another conventional ferroelectric memory device.

In the conventional reference level generation circuit 800 illustrated in FIG. 8A, only a single constant level potential is output from the reference signal generation circuit 109, whereby it is only possible to generate a constant level potential as the reference level. In contrast, in the reference level generation circuit 100 of the ferroelectric memory device 150 of this embodiment, a plurality of different potentials (levels) can be generated from the reference signal generation circuit 1 according to the voltage and temperature changes detected respectively by the external voltage detection circuit 2 and the temperature detection circuit 3. A level generated by the reference signal generation circuit 1 is charged into the capacitor 6, and the capacitor 6 is shorted with the bit line 7. Thus, a potential (reference level) is generated onto the bit line 7 by virtue of the charge sharing between the capacitor 6 and the bit line 7. The output from the reference signal generation circuit 1 is adjusted so that the potential appearing on the bit line 7 is at the intermediate level between the "H" level and the "L" level.

Figure 1B:
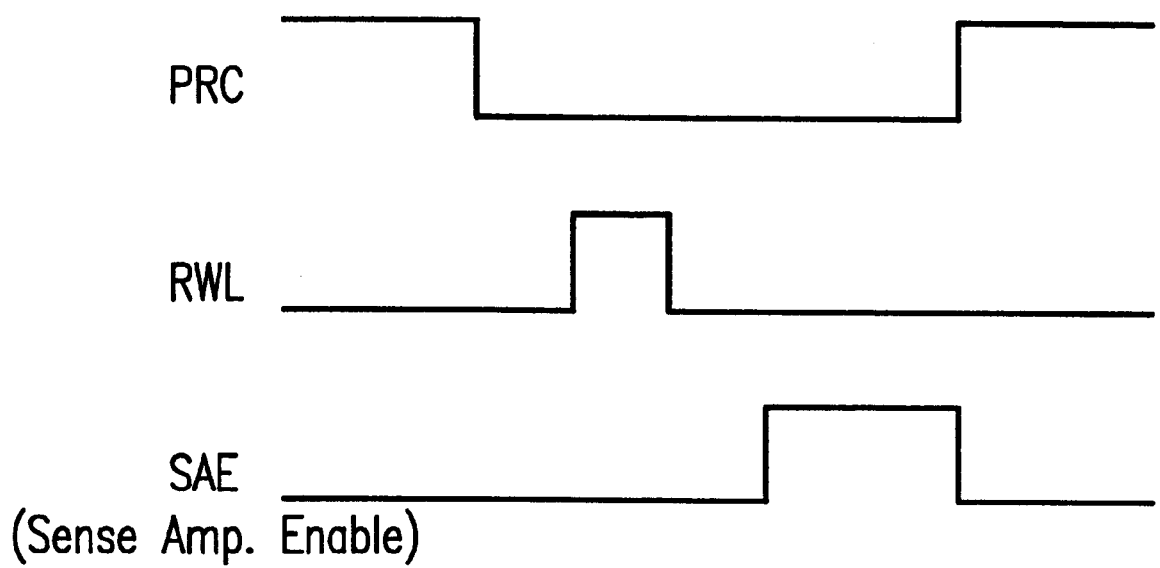
FIG. 1B is a timing diagram illustrating the transitions of the various signals according to Embodiment 1 of the present invention.
Figure 8B:
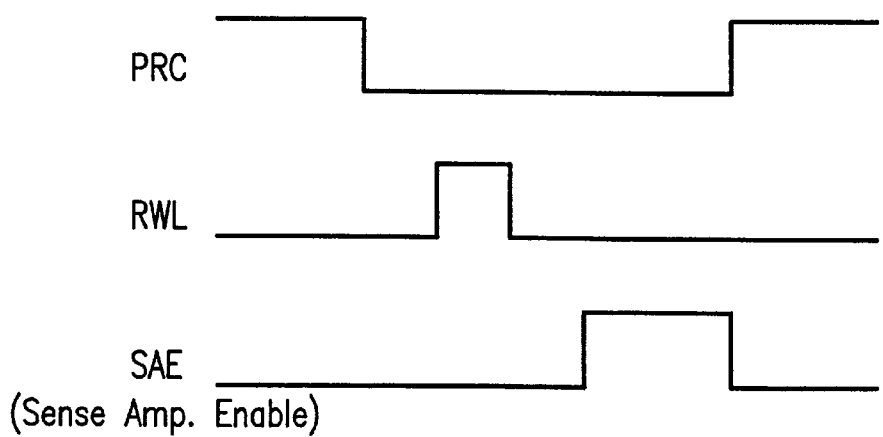
FIG. 8B is a timing diagram illustrating the transitions of the various signals used in the conventional ferroelectric memory device of FIG. 8A.

FIG. 1B shows a timing chart illustrating transitions of various signals during this operation. The transitions of these signals are the same as those described above with reference to FIG. 8B. Referring to the timing chart of FIG. 1B, the PRC signal is activated (indicated as the transition to the "H" level) to close the switch transistor 5 so that the capacitor 6 is charged by the reference signal generation circuit 1. At this time, the reference signal generation circuit 1 outputs a potential (level) according to the voltage and temperature changes detected respectively by the external voltage detection circuit 2 and the temperature detection circuit 3. Then, the PRC signal is deactivated (indicated as the transition to the "L" level), after which the RWL signal is activated (indicated as the transition to the "H" level) so as to close the switch transistor 4. Thus, a reference level is generated onto the bit line 7 by virtue of the charge sharing between the capacitor 6 and the capacitance of the bit line 7. After the reference level is generated, the SAE signal is activated (indicated as the transition to the "H" level) so as to enable the sense amplifier 15. Thus, the output signal from the selected memory cell 12 is compared with the reference level signal to amplify the signal corresponding to the output of the memory cell 12.

With the configuration of this embodiment, even when the level of the externally provided voltage or the ambient temperature changes, it is possible to selectively output one of a plurality of different levels which can be output by the reference signal generation circuit 1 based on the control provided by the external voltage detection circuit 2 and the temperature detection circuit 3. Moreover, the ferroelectric memory device of this embodiment is capable of generating a reference level without using any ferroelectric element and thus is free of the problem associated with the deterioration of reference cells.

Embodiment 2

Figure 2A:
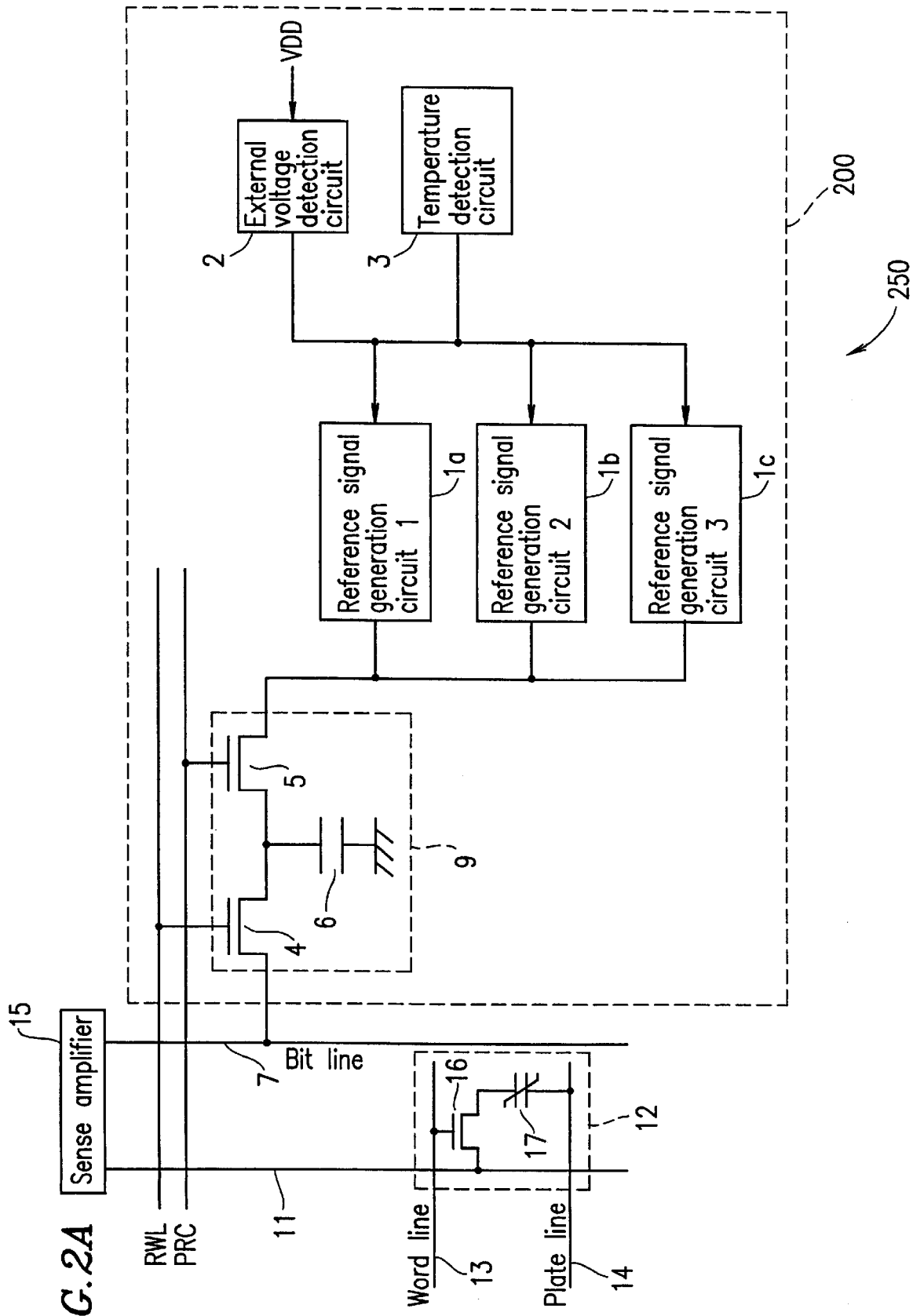
FIG. 2A illustrates a circuit configuration for generating a reference level used in a ferroelectric memory device according to Embodiment 2 of the present invention.

FIG. 2A illustrates a ferroelectric memory device 250 according to Embodiment 2 of the present invention, including a reference level generation circuit 200 for generating a reference level.

The reference level generation circuit 200 of the ferroelectric memory device 250 includes reference signal generation circuits 1a to 1c, the external voltage detection circuit 2, the temperature detection circuit 3 and the reference level adjustment section 9. As the reference level generation circuit 100 of Embodiment 1, the reference level adjustment section 9 includes the switch transistors 4 and 5 and the capacitor 6. The reference level generation circuit 200 includes the multiple reference signal generation circuits 1a to 1c for generating respectively different potentials (levels), instead of the single reference signal generation circuit 1 of Embodiment 1 shown in FIG. 1A which is capable of generating a plurality of different potentials (levels). As the reference signal generation circuit 1 of Embodiment 1, each of the reference signal generation circuits 1a to 1c generates a potential (level) by way of a resistance division, or the like, without using a ferroelectric element. Other than the reference level generation circuit 200, the ferroelectric memory device 250 has the same configuration as that of the ferroelectric memory device 150.

In the reference level generation circuit 200, the external voltage detection circuit 2 detects the potential of externally provided voltage VDD. Each of the external voltage detection circuit 2 and the temperature detection circuit 3 is connected to the reference signal generation circuits 1a to 1c. Each of the reference signal generation circuits 1a to 1c is connected to the source of the switch transistor 5. The drain of the switch transistor 5 is connected to the first electrode of the capacitor 6 and to the source of the switch transistor 4. The second electrode of the capacitor 6 is connected to the ground. The gates of the switch transistors 4 and 5 are connected to the RWL line and the PRC line, respectively. The drain of the switch transistor 4 is connected to the bit line 7. As described above, in the reference level generation circuit 200 of the ferroelectric memory device 250 of this embodiment, each of the external voltage detection circuit 2 and the temperature detection circuit 3 is connected to the reference signal generation circuits 1a to 1c. Therefore, it is possible to generate a plurality of different potentials (levels) by selectively activating the reference signal generation circuits 1a to 1c according to the voltage and temperature changes detected respectively by the external voltage detection circuit 2 and the temperature detection circuit 3. A level generated by one of the reference signal generation circuits 1a to 1c is charged into the capacitor 6, and the capacitor 6 Is shorted with the bit line 7. Thus, a potential (reference level) is generated onto the bit line 7 by virtue of the charge sharing between the capacitor 6 and the bit line 7. One of the reference signal generation circuits 1a to 1c is selectively activated so that the potential appearing on the bit line 7 is at the intermediate level between the "H" level and the "L" level.

Figure 2B:
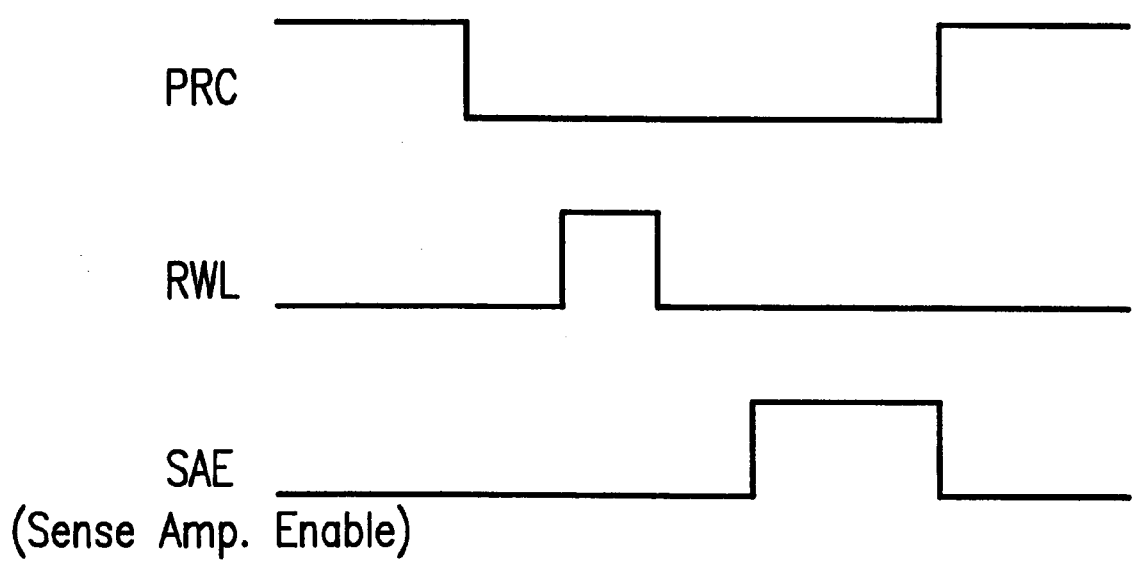
FIG. 2B is a timing diagram illustrating the transitions of the various signals according to Embodiment 2 of the present invention.

FIG. 2B shows a timing chart illustrating transitions of various signals during this operation. The transitions of these signals are the same as those described above with reference to FIG. 8B. Referring to the timing chart of FIG. 2B, the PRC signal is activated (indicated as the transition to the "H" level) to close the switch transistor 5 so that the capacitor 6 is charged by one of the reference signal generation circuits 1a to 1c. At this time, one of the reference signal generation circuits 1a to 1c is selectively activated according to the voltage and temperature changes detected respectively by the external voltage detection circuit 2 and the temperature detection circuit 3, so that a potential (level) is output from the selected one of the reference signal generation circuits 1a to 1c. Then, the PRC signal is deactivated (indicated as the transition to the "L" level), after which the RWL signal is activated (indicated as the transition to the "H" level) so as to close the switch transistor 4. Thus, a reference level is generated onto the bit line 7 by virtue of the charge sharing between the capacitor 6 and the capacitance of the bit line 7. After the reference level is generated, the SAE signal is activated (indicated as the transition to the "H" level) so as to enable the sense amplifier 15. Thus, the output from the selected memory cell 12 is compared with the reference level signal to amplify the signal corresponding to the output of the memory cell 12.

With the configuration of this embodiment, even when the level of the externally provided voltage or the ambient temperature changes, the plurality of different levels from the reference signal generation circuits 1a to 1a can be optimally selected and output based on the control provided by the external voltage detection circuit 2 and the temperature detection circuit 3. Moreover, the ferroelectric memory device of this embodiment is capable of generating a reference level without using any ferroelectric element and thus is free of the problem associated with the deterioration of reference cells.

Embodiment 3

Figure 3A:
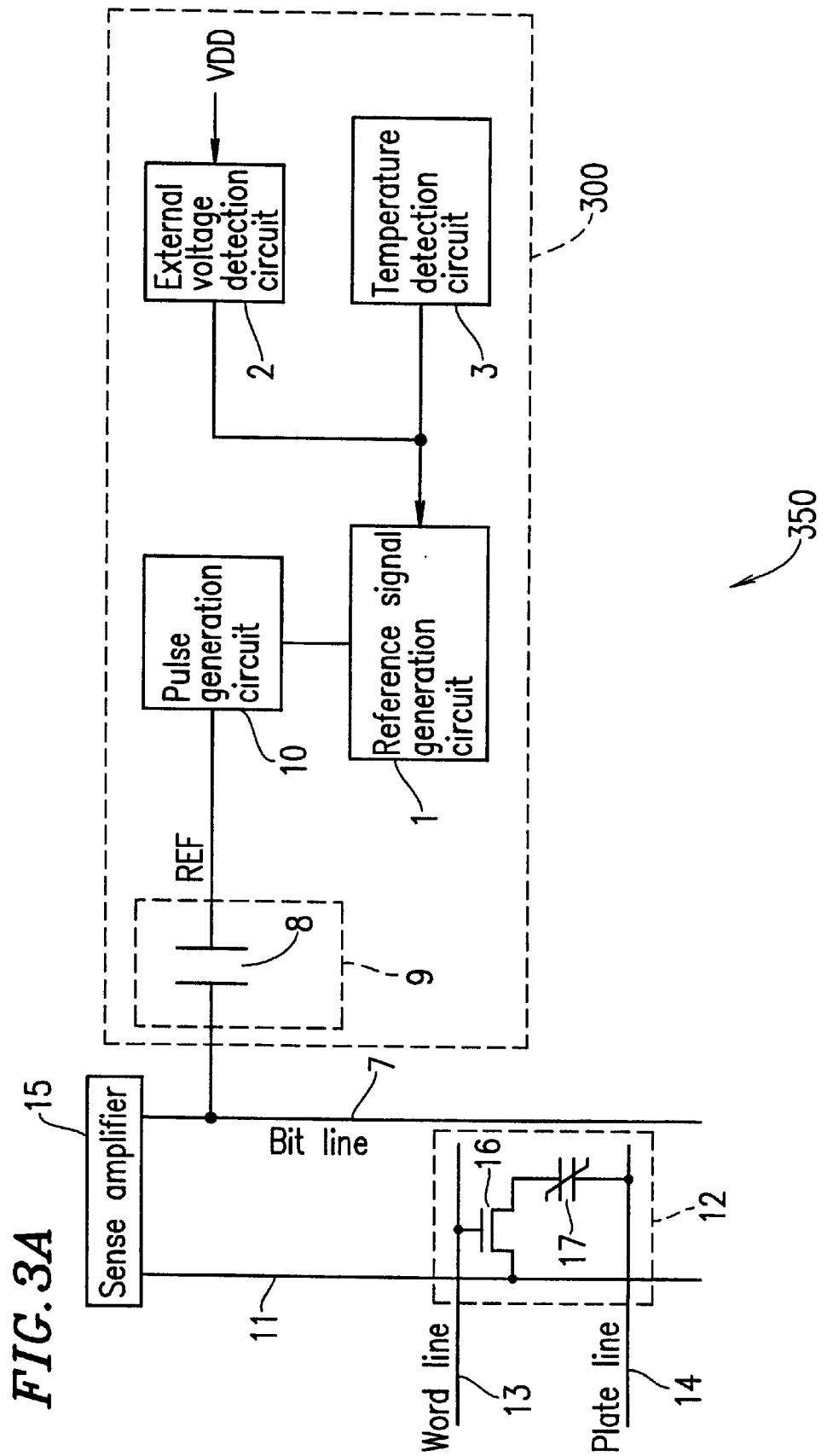
FIG. 3A illustrates a circuit configuration for generating a reference level used in a ferroelectric memory device according to Embodiment 3 of the present invention.

FIG. 3A illustrates a ferroelectric memory device 350 according to Embodiment 3 of the present invention, including a reference level generation circuit 300 for generating a reference level.

The reference level generation circuit 300 includes the reference signal generation circuit 1 (as that of the reference level generation circuit 100 of Embodiment 1) for generating a plurality of different potentials (levels) by way of a resistance division, or the like, without using a ferroelectric element, the external voltage detection circuit 2 for detecting a potential of externally provided voltage VDD, the temperature detection circuit 3 for detecting the ambient temperature, a pulse generation circuit 10 for determining the timing of signals output from the reference signal generation circuit 1, and the reference level adjustment section 9 for adjusting the potential output from the pulse generation circuit 10. In the reference level generation circuit 300, the reference level adjustment section 9 includes a capacitor 8. Each of the external voltage detection circuit 2 and the temperature detection circuit 3 is connected to the reference signal generation circuit 1. The reference signal generation circuit 1 is connected to the pulse generation circuit 10, which is connected to the first electrode of the capacitor 8. The second electrode of the capacitor 8 is connected to the bit line 7. Other than the reference level generation circuit 300, the ferroelectric memory device 350 has the same configuration as that of the ferroelectric memory device 150.

In the reference level generation circuit 300, a pulse is provided to the bit line 7 from the pulse generation circuit 10, and the potential (level) of the bit line 7 is boosted by coupling of the capacitor 8 to the bit line 7. At this time, the "H" level of the pulse is adjusted by adjusting the output of the reference signal generation circuit 1 so that the boosted level appearing on the bit line 7 is at the intermediate level between the "H" level and the "L" level of the memory cell 12.

Figure 9A:
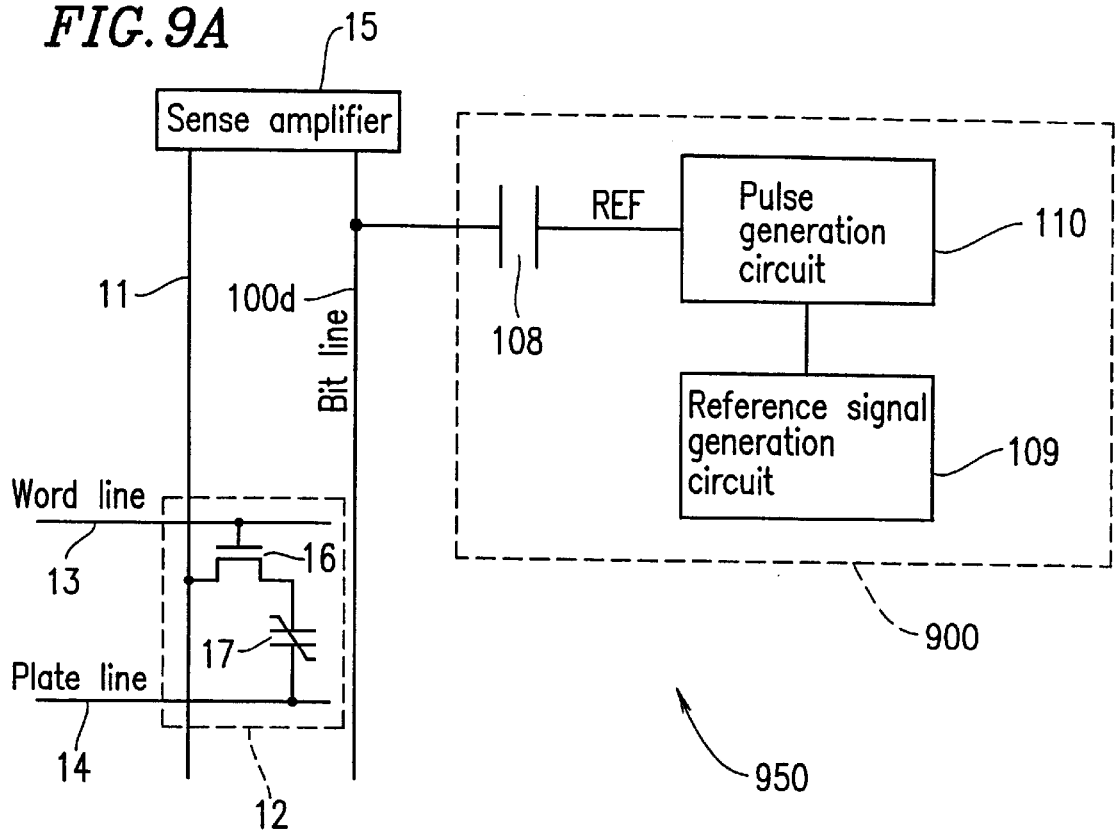
FIG. 9A illustrates a circuit configuration for generating a reference level used in another conventional ferroelectric memory device.

In the conventional reference level generation circuit 900 illustrated in FIG. 9A, the "H" level of the pulse is set to one level. In contrast, in the reference level generation circuit 300 of the ferroelectric memory device 350 of this embodiment, it is possible to generate a plurality of different potentials (levels) from the reference signal generation circuit 1 according to the voltage and temperature changes detected respectively by the external voltage detection circuit 2 and the temperature detection circuit 3. Thus, it is possible to set the "H" level of the pulse to an optimal level.

Figure 3B:
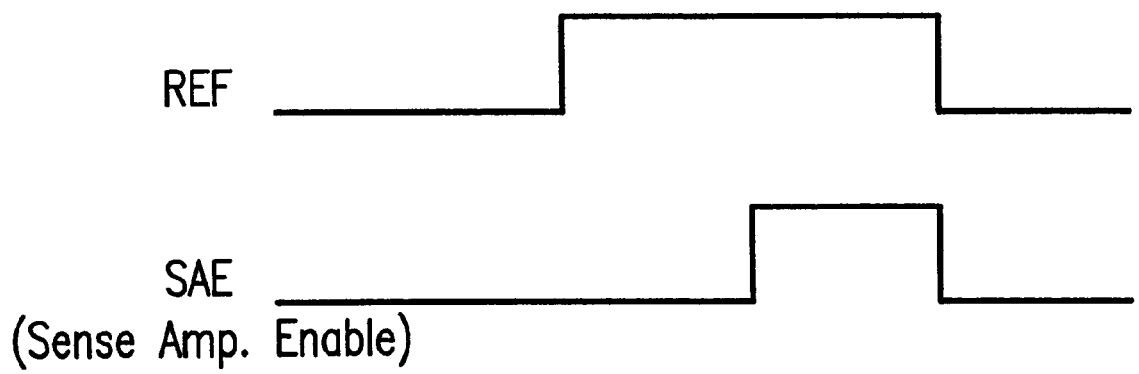
FIG. 3B is a timing diagram illustrating the transitions of the various signals according to Embodiment 3 of the present invention.
Figure 9B:
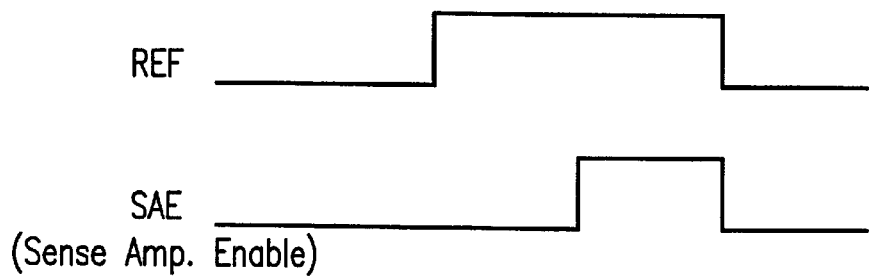
FIG. 9B is a timing diagram illustrating the transitions of the various signals used in the conventional ferroelectric memory device of FIG. 9A.

FIG. 3B shows a timing chart illustrating transitions of various signals during this operation. The transitions of these signals are the same as those described above with reference to FIG. 9B. In FIG. 3B, "REF" denotes the output from the reference signal generation circuit 1, based on which the potential of the "H" level of the pulse is determined. At this time, the reference signal generation circuit 1 outputs a potential (level) according to the voltage and temperature changes detected respectively by the external voltage detection circuit 2 and the temperature detection circuit 3. The timing of the "H" level of the pulse is determined by the pulse generation circuit 10. Moreover, the transition of the SAE signal for the sense amplifier 15 is the same as described above with reference to FIG. 9B.

With the reference level generation circuit 300 of the ferroelectric memory device 350 of this embodiment, even when the level of the externally provided voltage or the ambient temperature changes, the plurality of different levels from the reference signal generation circuit 1 can be optimally selected and output based on the control provided by the external voltage detection circuit 2 and the temperature detection circuit 3. Thus, it is possible to set the "H" level of the pulse to an optimal level. Moreover, the ferroelectric memory device of this embodiment is capable of generating a reference level without using any ferroelectric element and thus is free of the problem associated with the deterioration of reference cells.

Embodiment 4

Figure 4A:
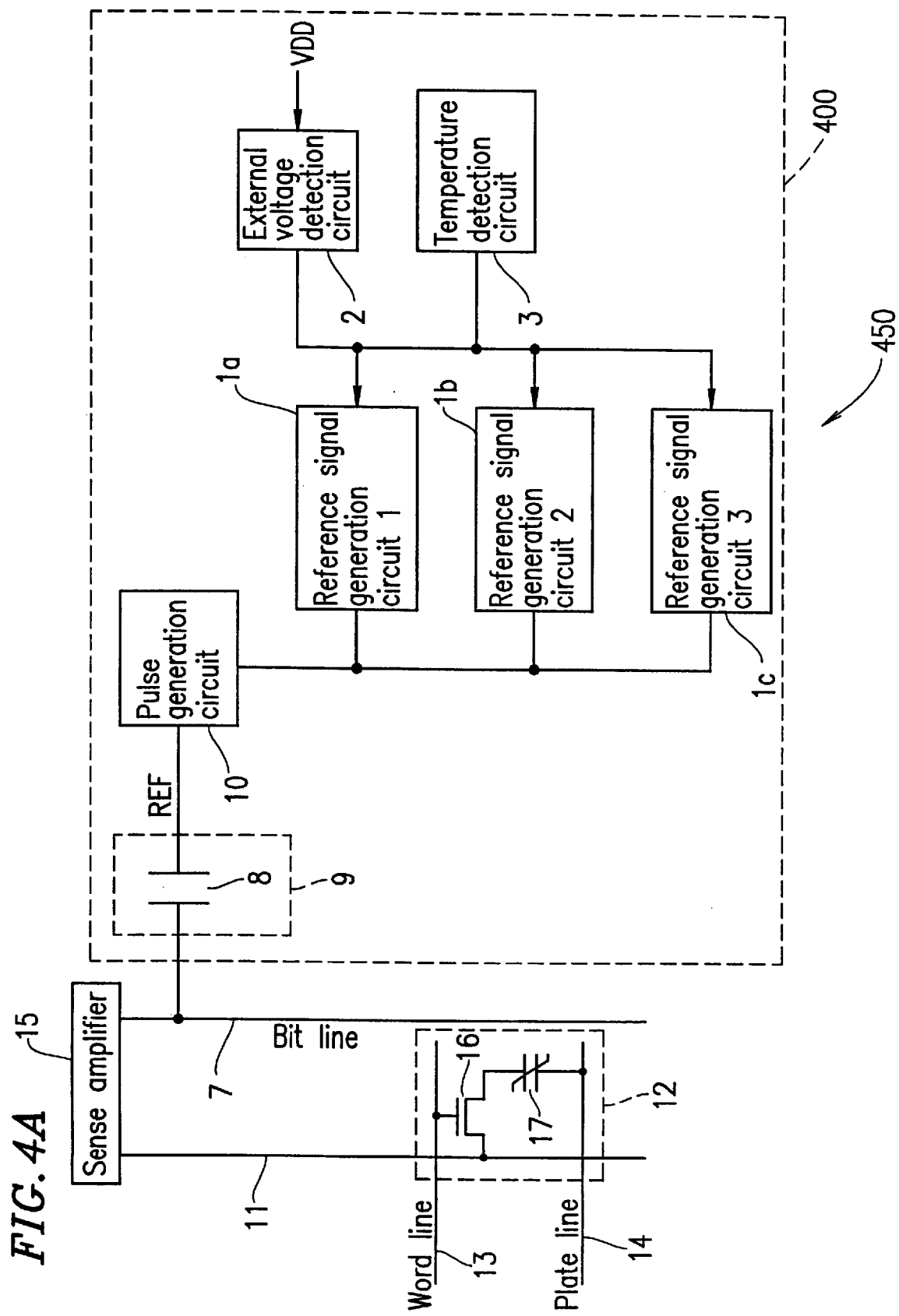
FIG. 4A illustrates a circuit configuration for generating a reference level used in a ferroelectric memory device according to Embodiment 4 of the present invention.

FIG. 4A illustrates a ferroelectric memory device 450 according to Embodiment 4 of the present invention, including a reference level generation circuit 400 for generating a reference level.

The reference level generation circuit 400 of the ferroelectric memory device 450 includes the reference signal generation circuits 1a to 1c, the external voltage detection circuit 2, the temperature detection circuit 3, the pulse generation circuit 10, and the reference level adjustment section 9. As the reference level generation circuit 300 of Embodiment 3, the reference level adjustment section 9 includes the capacitor 8. The reference level generation circuit 400 includes the multiple reference signal generation circuits 1a to 1c for generating respectively different potentials (levels), instead of the single reference signal generation circuit 1 of Embodiment 3 shown in FIG. 3A which is capable of generating a plurality of different potentials (levels). Each of the external voltage detection circuit 2 and the temperature detection circuit 3 is connected to the reference signal generation circuits 1a to 1c. Each of the reference signal generation circuits 1a to 1c is connected to the pulse generation circuit 10, which is connected to the first electrode of the capacitor 8. The second electrode of the capacitor 8 is connected to the bit line 7. Other than the reference level generation circuit 400, the ferroelectric memory device 450 has the same configuration as that of the ferroelectric memory device 150.

In the reference level generation circuit 400, a pulse is provided to the bit line 7 from the pulse generation circuit 10, and the potential (level) of the bit line 7 Is boosted by coupling of the capacitor 8 to the bit line 7. At this time, the "H" level of the pulse is adjusted by selectively activating one of the reference signal generation circuits 1a to 1c so that the boosted level appearing on the bit line 7 is at the intermediate level between the "H" level and the "L" level.

With the reference level generation circuit 400 of the ferroelectric memory device 450 of this embodiment, it is possible to generate a plurality of different potentials (levels) by selectively activating the reference signal generation circuits 1a to 1c according to the voltage and temperature changes detected respectively by the external voltage detection circuit 2 and the temperature detection circuit 3. Thus, it is possible to set the "H" level of the pulse to an optimal level.

Figure 4B:
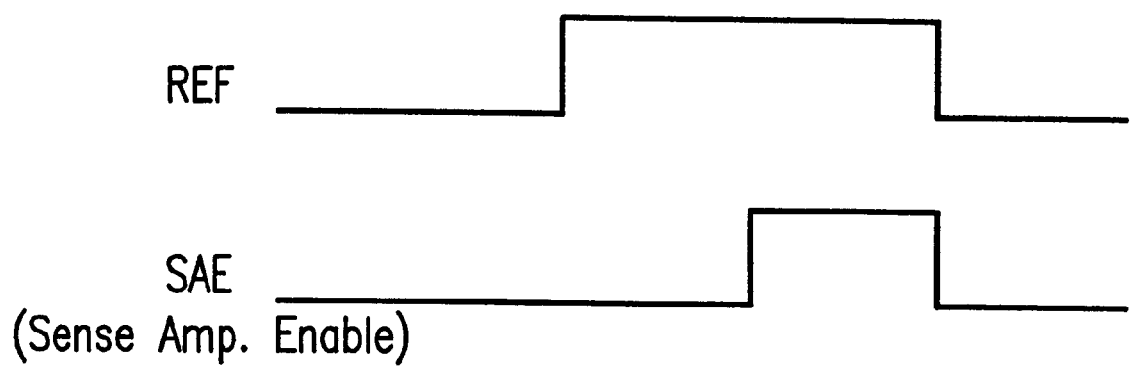
FIG. 4B is a timing diagram illustrating the transitions of the various signals according to Embodiment 4 of the present invention.

FIG. 4B shows a timing chart illustrating transitions of various signals during this operation. The transitions of these signals are the same as those described above with reference to FIG. 9B. In FIG. 4B, "REF" denotes the output from the selectively activated one of the reference signal generation circuits 1a to 1c, based on which the potential of the "H" level of the pulse Is determined. At this timer the selectively activated one of the reference signal generation circuits 1a to 1c outputs a potential (level) according to the voltage and temperature changes detected respectively by the external voltage detection circuit 2 and the temperature detection circuit 3. The timing of the "H" level of the pulse is determined by the pulse generation circuit 10. Moreover, the transition of the SAE signal for the sense amplifier 15 is the same as described above with reference to FIG. 9B.

With the reference level generation circuit 400 of the ferroelectric memory device 450 of this embodiment, even when the level of the externally provided voltage or the ambient temperature changes, the plurality of different levels from the reference signal generation circuits 1a to 1c can be optimally selected and output based on the control provided by the external voltage detection circuit 2 and the temperature detection circuit 3. Thus, it is possible to set the "H" level of the pulse to an optimal level. Moreover, the ferroelectric memory device of this embodiment is capable of generating a reference level without using any ferroelectric element and thus is free of the problem associated with the deterioration of reference cells.

Embodiment 5

FIG. 5A illustrates a ferroelectric memory device 550 according to Embodiment 5 of the present invention, including a reference level generation circuit 500 for generating a reference level.

The reference level generation circuit 500 includes the reference signal generation circuit 1 (as that of the reference level generation circuit 100 of Embodiment 1) for generating a plurality of different potentials (levels) by way of a resistance division, or the like, without using a ferroelectric element, the external voltage detection circuit 2 for detecting a potential of externally provided voltage VDD, the temperature detection circuit 3 for detecting the ambient temperature and the reference level adjustment section 9. In the reference level generation circuit 500, the reference level adjustment section 9 includes a switch transistor 21. Each of the external voltage detection circuit 2 and the temperature detection circuit 3 is connected to the reference signal generation circuit 1. The reference signal generation circuit 1 and the bit line 7 are connected to each other via the switch transistor 21. The PRRF signal is input to the gate of the switch transistor 21. Other than the reference level generation circuit 500, the ferroelectric memory device 550 has the same configuration as that of the ferroelectric memory device 150.

In the reference level generation circuit 500, a reference level is directly provided from the reference signal generation circuit 1 to the bit line 7 via the switch transistor 21. The provided level is the intermediate level between the "H" level and the "L" level of the memory cell 12.

Figure 10A:
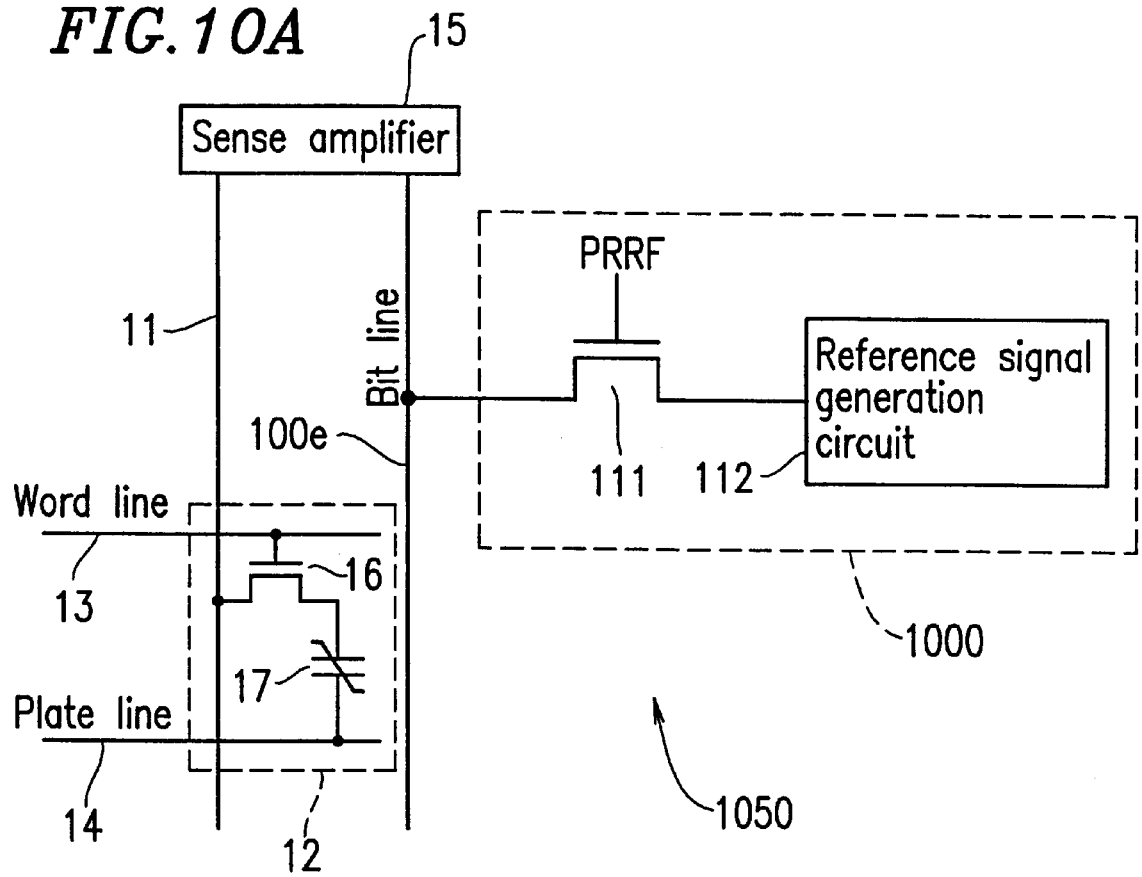
FIG. 10A illustrates a circuit configuration for generating a reference level used in another conventional ferroelectric memory device.

In the conventional reference level generation circuit 1000 illustrated in FIG. 10A, the reference level is fixed to one level. In contrast, in the reference level generation circuit 500 of the ferroelectric memory device 550 of this embodiment, it is possible to generate a plurality of different potentials (levels) from the reference signal generation circuit 1 according to the voltage and temperature changes detected respectively by the external voltage detection circuit 2 and the temperature detection circuit 3.

Figure 5B:
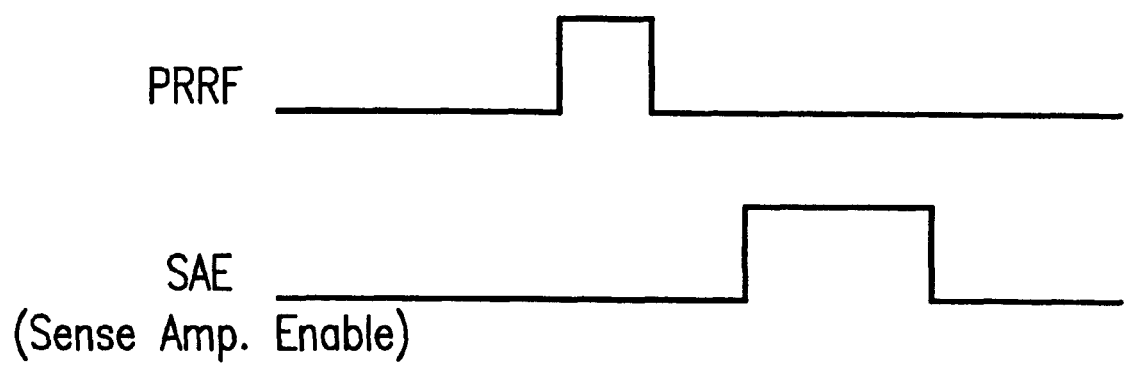
FIG. 5B is a timing diagram illustrating the transitions of the various signals according to Embodiment 5 of the present invention.
Figure 10B:
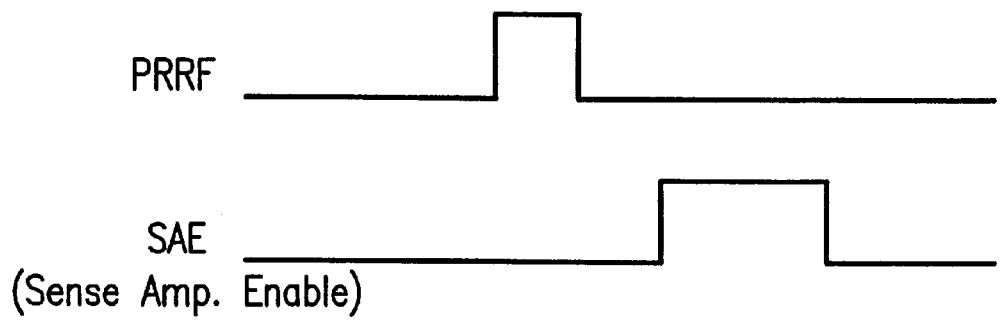
FIG. 10B is a timing diagram illustrating the transitions of the various signals used in the conventional ferroelectric memory device of FIG. 10A.

FIG. 5B shows a timing chart illustrating transitions of various signals during this operation. The transitions of these signals are the same as those described above with reference to FIG. 10B. Referring to the timing chart of FIG. 5B, the PRRF signal is activated (indicated as the transition to the "H" level) to close the switch transistor 21 so that the reference level generated by the reference signal generation circuit 1 is provided to the bit line 7. After the reference level is generated, the SAE signal is activated (indicated as the transition to the "H" level) so as to enable the sense amplifier 15. Thus, the output from the selected memory cell 12 is compared with the reference level signal to amplify the signal corresponding to the output of the selected memory cell 12.

With the reference level generation circuit 500 of the ferroelectric memory device 550 of this embodiment, even when the level of the externally provided voltage or the ambient temperature changes, the plurality of different levels from the reference signal generation circuit 1 can be optimally selected and output based on the control provided by the external voltage detection circuit 2 and the temperature detection circuit 3. Moreover, the ferroelectric memory device of this embodiment is capable of generating a reference level without using any ferroelectric element and thus is free of the problem associated with the deterioration of reference cells.

Embodiment 6

FIG. 6A illustrates a ferroelectric memory device 650 according to Embodiment 6 of the present invention, including a reference level generation circuit 600 for generating a reference level.

The reference level generation circuit 600 of the ferroelectric memory device 650 includes the reference signal generation circuits 1a to 1c, the external voltage detection circuit 2, the temperature detection circuit 3 and the reference level adjustment section 9. As the reference level generation circuit 500 of Embodiment 5, the reference level adjustment section 9 includes the switch transistor 21. The reference level generation circuit 600 includes the multiple reference signal generation circuits 1a to 1c for generating respectively different potentials (levels), instead of the single reference signal generation circuit 1 of Embodiment 5 shown in FIG. 5A which is capable of generating a plurality of different potentials (levels). Each of the external voltage detection circuit 2 and the temperature detection circuit 3 is connected to the reference signal generation circuits 1a to 1c. Each of the reference signal generation circuits 1a to 1c is connected to the bit line 7 via the switch transistor 21. The PRRF signal is input to the gate of the switch transistor 21. Other than the reference level generation circuit 600, the ferroelectric memory device 650 has the same configuration as that of the ferroelectric memory device 150.

In the reference level generation circuit 600, a reference level is directly provided from selectively activated one of the reference signal generation circuits 1a to 1c to the bit line 7 via the switch transistor 21. The provided level is the intermediate level between the "H" level and the "L" level of the memory cell 12.

With the reference level generation circuit 600 of the ferroelectric memory device 650 of this embodiment, it is possible to generate a plurality of different potentials (levels) by selectively activating the reference signal generation circuits 1a to 1c according to the voltage and temperature changes detected respectively by the external voltage detection circuit 2 and the temperature detection circuit 3.

Figure 6B:
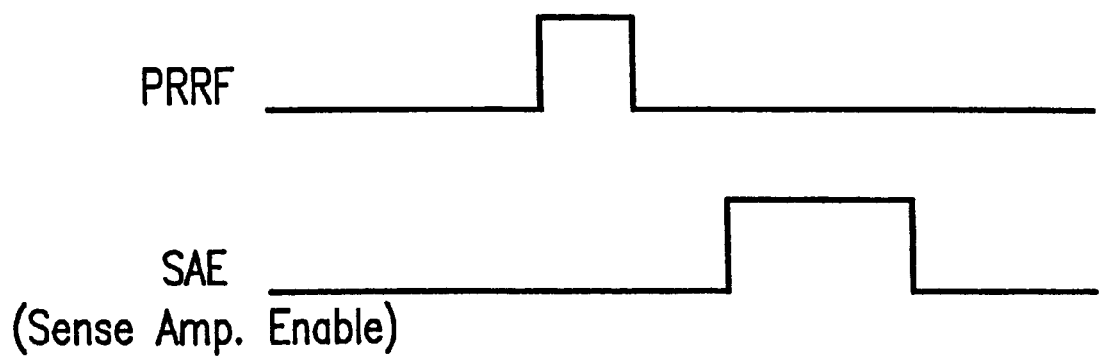
FIG. 6B is a timing diagram illustrating the transitions of the various signals according to Embodiment 6 of the present invention.

FIG. 6B shows a timing chart illustrating transitions of various signals during this operation. The transitions of these signals are the same as those described above with reference to FIG. 10B. Referring to the timing chart of FIG. 6B, PRRF signal is activated (indicated as the transition to the "H" level) to close the switch transistor 21 so that the reference level generated by the selectively activated one of the reference signal generation circuits 1a to 1c is provided to the bit line 7. After the reference level is generated, the SAE signal is activated (indicated as the transition to the "H" level) so as to enable the sense amplifier 15. Thus, the output from the selected memory cell 12 is compared with the reference level signal to amplify the signal corresponding to the output of the selected memory cell 12.

With the reference level generation circuit 600 of the ferroelectric memory device 650 of this embodiment, even when the level of the externally provided voltage or the ambient temperature changes, the plurality of different levels from the reference signal generation circuits 1a to 1c can be optimally selected and output based on the control provided by the external voltage detection circuit 2 and the temperature detection circuit 3. Moreover, the ferroelectric memory device of this embodiment is capable of generating a reference level without using any ferroelectric element and thus is free of the problem associated with the deterioration of reference cells.

Figure 6C:
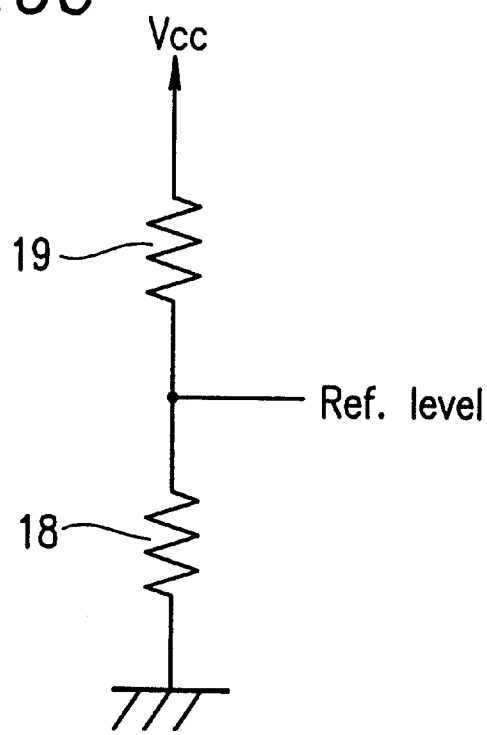
FIG. 6C illustrates a resistance division circuit configuration for generating an intended potential by way of a resistance division.
Figure 6D:
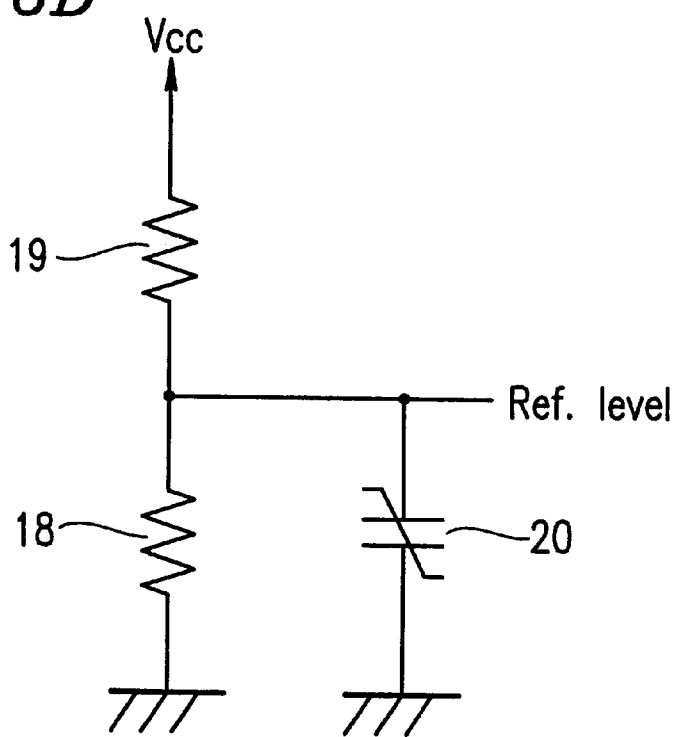
FIG. 6D illustrates another resistance division circuit configuration which uses a capacitor.
Figure 7A:
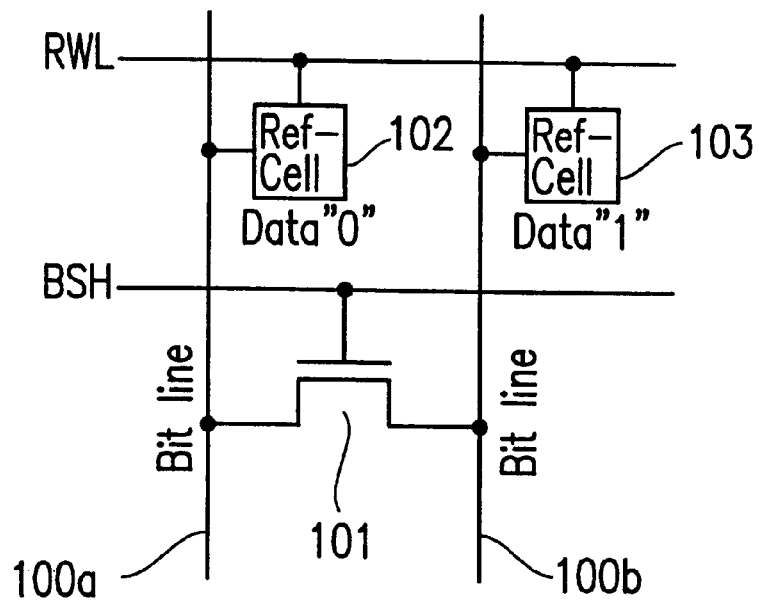
FIG. 7A illustrates a circuit configuration for generating a reference level used in a conventional ferroelectric memory device.
Figure 7B:
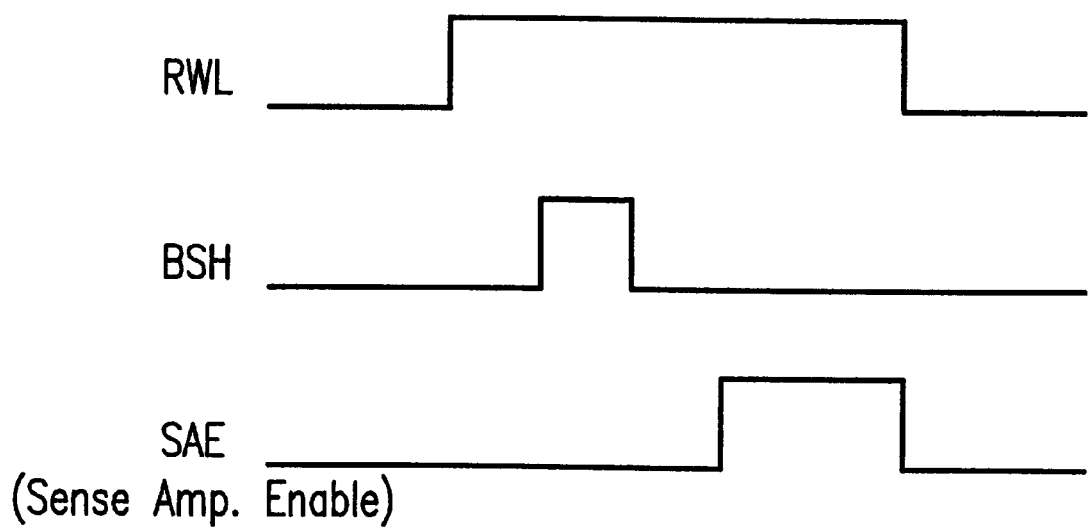
FIG. 7B is a timing diagram illustrating the transitions of the various signals used in the conventional ferroelectric memory device of FIG. 7A.

FIG. 6C illustrates a resistance division circuit configuration used in the reference signal generation circuit 1 for generating an intended potential by way of a resistance division. Resistors 18 and 19 are serially connected to each other. The first electrode of the resistor 18 is grounded, and voltage Vcc is applied to the first electrode of the resistor 19. In this configuration, the voltage between the resistors 18 and 19 can be used as a reference level so as to generate an intended potential.

Where a reference signal generation circuit uses a ferroelectric capacitor or any other ferroelectric element, the ferroelectric capacitor can be used as a path condenser for the reference level generation circuit so as to generate a reference level without polarization of the ferroelectric element. FIG. 6D illustrates another resistance division circuit configuration used in the reference signal generation circuit 1 which uses a capacitor. The configuration of FIG. 6D is obtained by additionally providing a capacitor 20 along the signal path in the configuration illustrated in FIG. 6C. A ferroelectric capacitor may be used for the capacitor, in which case it is possible to obtain a larger capacitance for a smaller area. In such a case, the ferroelectric capacitor will not undergo polarity inversion, whereby it is possible to avoid the problems associated with deterioration in reference cells.

When the reference level adjustment section 9 is intended to adjust potentials, signal VDD and the signal generated by the reference signal generation circuit 1 can be input to the reference level adjustment section 9 as the "H" signal and the "L" signal, respectively. Alternatively, the signal generated by the reference signal generation circuit 1 may be used as the "H" signal and the GND as the "L" signal.

While each of the above-described embodiments employs both the external voltage detection circuit 2 and the temperature detection circuit 3, it should be apparent to those skilled in the art that the use of either one of these circuits would still be within the scope of the present invention. Moreover, while the embodiments have been described above with respect to a single memory cell, it should be understood that a memory device generally includes a plurality of memory cells.

As described above in detail, according to the present invention, it is possible to suitably generate a reference level for use in a memory device without using a ferroelectric capacitor or any other ferroelectric element. Where a ferroelectric capacitor or any other ferroelectric element is used, it is possible to generate a reference level without polarization of the ferroelectric element. Thus, it is possible to provide a ferroelectric memory device which is free of the problem in the prior art associated with the deterioration of reference cells due to repeated read/write operations. When the external voltage or the ambient temperature changes, the reference level can be controlled to follow changes in the characteristics of a ferroelectric element due to the changes in the level of the externally provided voltage or the ambient temperature.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A ferroelectric memory device, comprising at least one memory cell which includes a semiconductor transistor and a ferroelectric capacitor, the ferroelectric memory device reading out data from each of the at least one memory cell and comparing the read data with a reference level signal to amplify a signal corresponding to the data read out from the at least one memory cell, the ferroelectric memory device further comprising:

at least one of an external voltage detection circuit for detecting a level of a voltage externally provided to the ferroelectric memory device and a temperature detection circuit for detecting an ambient temperature around the ferroelectric memory device;

a reference signal generation circuit connected to the at least one of the external voltage detection circuit and the temperature detection circuit for outputting a potential based on an output from the at least one of the external voltage detection circuit and the temperature detection circuit; and a reference level adjustment section for adjusting the potential output from the reference signal generation circuit into a suitable reference level signal.

2. A ferroelectric memory device according to claim 1, wherein:

the ferroelectric memory device comprises a plurality of the reference signal generation circuits; and the at least one of the external voltage detection circuit and the temperature detection circuit selects an optimal one of the plurality of the reference signal generation circuits.

3. A ferroelectric memory device according to claim 1, wherein the reference signal generation circuit does not include a ferroelectric element.

4. A ferroelectric memory device according to claim 1, wherein:

the reference signal generation circuit includes a ferroelectric element; and the ferroelectric element does not undergo polarization during the adjustment of the potential output from the reference signal generation circuit into a suitable reference level signal.

5. A ferroelectric memory device according to claim 1, wherein the reference level adjustment section includes a capacitor for temporarily storing a potential.

6. A ferroelectric memory device according to claim 5, wherein:

the reference level adjustment section further includes at least two switches;

the reference signal generation circuit is connected to the capacitor via one of the two switches; and the capacitor is connected to the memory cell via the other one of the two switches.

7. A ferroelectric memory device according to claim 1, further comprising a pulse generation circuit for determining a timing of the signal generated by the reference signal generation circuit.

8. A ferroelectric memory device according to claim 7, wherein the reference level adjustment section includes a capacitor between the pulse generation circuit and the memory cell.

9. A ferroelectric memory device according to claim 1, wherein the reference level adjustment section includes a switch.

10. A ferroelectric memory device according to claim 8, wherein the pulse generation circuit generates a pulse having an "H" level and a "L" level, the "H" level corresponding to a potential generated by the reference level generation circuit and the "L" level corresponding to VDD or another potential which is lower than the "H" level.

11. A method for generating a reference level signal for use in a ferroelectric memory device, comprising at least one memory cell which includes a semiconductor transistor and a ferroelectric capacitor, the ferroelectric memory device reading out data from each of the at least one memory cell and comparing the read data with a reference level signal to amplify a signal corresponding to the data read out from the at least one memory cell, the method comprising the steps of:

detecting at least one of a level of a voltage externally provided to the ferroelectric memory device and an ambient temperature around the ferroelectric memory device;

providing a potential based on at least one of the level of the externally provided voltage and the temperature; and adjusting the potential into a reference level signal having a potential level between an "H" level and an "L" level of the memory cell.

* * * * *